United States Patent [19]
Izuha et al.

[11] Patent Number: 6,060,735
[45] Date of Patent: May 9, 2000

[54] THIN FILM DIELECTRIC DEVICE

[75] Inventors: Mitsuaki Izuha, Yokohama; Noboru Fukushima, Tokyo; Kazuhide Abe, Kawasaki, all of Japan

[73] Assignee: Kabushiki Kaisha Toshiba, Japan

[21] Appl. No.: 08/923,123

[22] Filed: Sep. 4, 1997

[30] Foreign Application Priority Data

Sep. 6, 1996 [JP] Japan ..................................... 8-236494
Jan. 30, 1997 [JP] Japan ..................................... 9-017047

[51] Int. Cl.⁷ .............................. H01L 29/78; H01L 33/00
[52] U.S. Cl. ........................................... 257/295; 257/296
[58] Field of Search ..................................... 257/295, 296

[56] References Cited

FOREIGN PATENT DOCUMENTS 96-1786   1/1996   Rep. of Korea .
97-5379   2/1997   Rep. of Korea .

*Primary Examiner*—Stephen D. Meier
*Attorney, Agent, or Firm*—Finnegan, Henderson, Farabow, Garrett & Dunner, L.L.P.

[57] ABSTRACT

A thin film dielectric device is disclosed, that comprises a substrate, a lower electrode formed on the substrate and composed of a laminate film having columnar grains that have grown in a vertical to a surface of the substrate, a dielectric thin film formed on the lower electrode and composed of a perovskite oxide, the dielectric thin film being a polycrystalline film having columnar grains that have successively grown from the columnar grains of the lower electrode and that takes over a crystal orientation of the lower electrode, the lattice constant of the lower electrode being matched with the lattice constant of the dielectric thin film at the interface therebetween with the columnar grains, and an upper electrode formed on the dielectric thin film. The lattice matching of the columnar grains solves problems of the increase of the leak current of the thin film dielectric device and the degradation of the dielectric breakdown resistance. In addition, the polycrystalline film having the columnar grains that succeed at the interface of the electrode/dielectric thin film can be properly formed on the semiconductor substrate such as Si substrate. Thus, the thin film dielectric device according to the present invention can be applied to a real LSI circuit and so forth.

22 Claims, 5 Drawing Sheets

AXIS X : 20MV/mdiv

AXIS Y : 0.1C/m² div

THIN FILM DIELECTRIC DEVICE

BACKGROUND OF THE INVENTION

1. Field of the Invention

The present invention relates to a thin film dielectric device having a dielectric thin film composed of a perovskite oxide.

2. Description of the Related Art

In recent years, materials with high permittivity and ferroelectricity of thin film dielectric devices (thin film capacitors) that are disposed on large storage DRAMs and non-volatile ferroelectricity memories (FRAMs) and device structures thereof have been intensively studied. For example, the dielectric constants of perovskite oxides such as $SrTiO_3$ (hereinafter referred to as STO) and $Ba_{1-x}Sr_xTiO_3$ (hereinafter referred to as BSTO) are much larger than the dielectric constants of conventional materials such as $SiO_2$, $Si_3N_4$, and $Ta_2O_5$. Thus, even if memory cells are finely structured, a sufficient storage capacity of electric charges can be obtained. In addition, a desired storage capacitance can be accomplished without need to use a complicated capacitor structure.

In a thin film dielectric device having a dielectric thin film composed of a perovskite oxide, it is considered that a noble metal such as Pt or Ru, an oxide of such as Ru, or a laminate film thereof to be a lower electrode. Among them, Ru has an excellent machinability and can be finely patterned by reactive ion etching (RIE) method or the like. Thus, it was considered that Ru is an excellent material of a capacitor electrode.

However, in a thin film dielectric device of which Ru or an oxide thereof is used for a lower electrode, a large amount of interface levels will take place due to ion defeats resulting from the mismatching of the interface an electrode and a dielectric thin film. The interface levels causes a leak current to increase and a dielectric breakdown resistance to decrease.

On the other hand, it is considered to use a conductive perovskite oxide having the same crystal structure as the above-described STO and BSTO for the material of an electrode, in particular, for the material of a lower electrode. When a conductive perovskite oxide is used for a lower electrode and it is epitaxially grown from the lower electrode to a dielectric thin film composed of the perovskite oxide or to an upper electrode, the lower electrode and the dielectric thin film are highly matched at the interface thereof. In addition, the dielectric thin film and the upper electrode are highly matched at the interface thereof. It is expected that such an epitaxially grown film suppresses the leak current due to a large amount of interface levels from increasing and the dielectric breakdown resistance from degradation.

To actually fabricate a thin film dielectric device that is epitaxially grown, a single crystal substrate composed of MgO or $SrTiO_3$ should be used for a substrate. However, in a real LSI circuit or the like, the lower electrode should be formed on a plug composed of poly-silicon or tungsten (Si plug or W plug). It is very difficult to epitaxially grow the lower electrode composed of a conductive perovskite oxide on a plug composed of poly-silicon in a good condition. Thus, the electrode and the dielectric thin film cannot be highly matched at the interface thereof.

On the other hand, it is considered to use a polycrystalline film composed of a conductive perovskite oxide for a lower electrode. For example, a structure of which a polycrystalline film composed of a conductive perovskite oxide such as $SuRuO_3$ is formed on a plug composed of poly-silicon or the like through a barrier metal layer composed of such as TiN as a lower electrode and then a dielectric thin film composed of for example BSTO is formed on the polycrystalline film has been considered. However, in such a structure, the morphology degrades at the interface of the lower electrode and the dielectric thin film and at the interface of the dielectric thin film and the upper electrode. The degradation of the morphology at the interface causes the leak current to increase or a capacitor to short-circuit.

As described above, in a conventional thin film dielectric device having a dielectric thin film composed of perovskite oxide, when a noble metal such as Ru or an oxide thereof is used for a lower electrode, since the dielectric thin film and the lower electrode are not matched at the interface thereof, the leak current increases or the dielectric breakdown resistance decreases.

When the conductive perovskite oxide is used for the lower electrode and epitaxially grown, the substrate thereof is restricted. Thus, an epitaxial film of the conductive perovskite oxide cannot be used for a real LSI circuit or the like due to restrictions on process and device structure. When a polycrystalline film of the conductive perovskite oxide is used for the lower electrode, the morphology degrades at the interface thereof. The degradation of the morphology at the interface causes the leak current to increase or a capacitor to short-circuit.

Thus, in the thin film dielectric device having the dielectric thin film composed of the perovskite oxide, the lattice constant of the electrode and the lattice constant of the dielectric thin film should be highly matched. In addition, when the conductive perovskite oxide is used for the electrode, the flatness of the surface of the polycrystalline film should be improved. Thus, the problems of which the leak current increases and the dielectric breakdown resistance decreases should be solved. In addition, such a thin film dielectric device should be applied to a real LSI or the like.

SUMMARY OF THE INVENTION

Thus, an object of the present invention is to provide a thin film dielectric device that allows the lattice constant of an electrode and the lattice constant of a dielectric thin film to be highly matched so as to suppress a leak current from increasing and a dielectric breakdown resistance from decreasing. Another object of the present invention is to provide a thin film dielectric device that can be applied to a real LSI or the like. A further object of the present invention is to provide a thin film dielectric device having a polycrystalline film of a conductive perovskite oxide with high surface flatness so as to suppress the morphology at the interface of an electrode and a dielectric thin film from degrading, thereby suppressing a leak current from increasing and a dielectric breakdown resistance from decreasing.

The present invention is a thin film dielectric device that comprises a substrate having a capacitor surface, a lower electrode formed on said substrate and composed of a polycrystalline film having columnar grains that have grown in a vertical direction to a capacitor surface of said substrate, a dielectric thin film formed on said lower electrode and composed of a perovskite oxide, said dielectric thin film being a polycrystalline film having columnar grains that have successively grown from the columnar grains of said lower electrode and that takes over a crystal orientation of said lower electrode in each of said columnar grains of said dielectric thin film, the lattice constant of said dielectric thin film being in each of said columnar grains thereof substantially matched with the lattice constant of said lower electrode at the interface with the columnar grains of said lower electrode, and an upper electrode formed on said dielectric thin film.

Namely, the microstructure of said capacitors can be described as follows.

Said bottom electrode film and said dielectric film are composed of continuous columnar grains and bottom electrode and dielectric share each column at the interface of dielectrics and bottom electrode in each column, the crystallographic relation between dielectric and electrode material is epitaxial: the crystal lattice is continuous and dielectric and electrode crystals share crystallographic axes.

The conductive perovskite oxide electrode formed immediately on a substrate, a plug, or the like or through a barrier metal is a polycrystalline having columnar grains. When the mismatch of the lattice constant of the dielectric composed of a perovskite oxide formed on the conductive perovskite oxide electrode and the lattice constant of the dielectric is in a predetermined range, the dielectric layer grows taking over the columnar grains of the lower electrode. In such a laminate film, the crystal orientation is also taken over. In the columnar grains, the interface of the lower electrode and the dielectric thin film epitaxially grows. The interface is almost free of ion defects and electronic interface levels. Such a local expitaxial structure can be formed at not only the interface of the lower electrode and the dielectric thin film, but the interface of the dielectric thin film and the upper electrode composed of the conductive perovskite oxide. After all, the local expitaxial structure is further effective when it is applied to both the interface of the upper electrode and the dielectric thin film and the interface of the lower electrode and the dielectric thin film.

In the thin film dielectric device according to the present invention, the laminate film portion of the electrode and the dielectric thin film is a polycrystalline film having columnar grains with a local epitaxial structure. Since the lattice constant of the electrode and the lattice constant of the dielectric thin film are matched in the columnar grains, a large amount of interface levels due to ion defects can be suppressed. Consequently, an excessive leak current and a dielectric breakdown resistance can be suppressed. In addition, since the thin film dielectric device according to the present invention is composed of a polycrystalline film, it can be formed on a variety of substrates for real LSIs and so forth.

These and other objects, features and advantages of the present invention will become more apparent in light of the following detailed description of best mode embodiments thereof, as illustrated in the accompanying drawings.

DESCRIPTION OF PREFERRED EMBODIMENTS

Next, embodiments of the present invention will be described.

Figure 1:
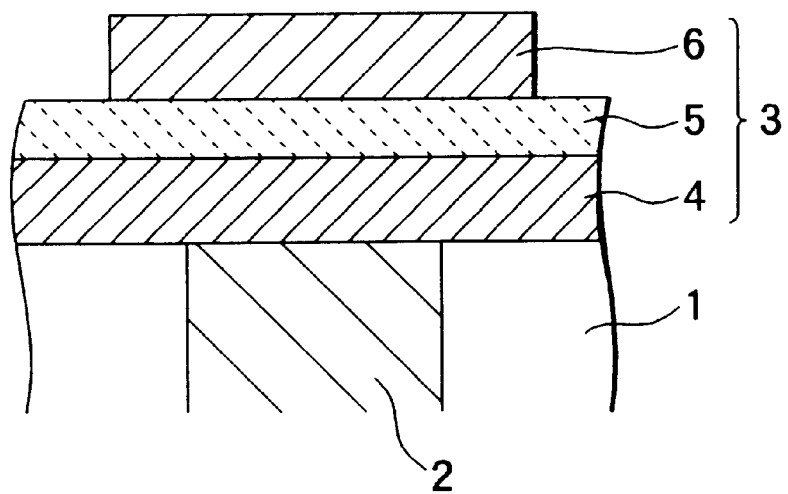
FIG. 1 is a sectional view showing the structure of a thin film dielectric device according to an embodiment of the present invention.

FIG. 1 is a sectional view showing the structure of a thin film dielectric device according to an embodiment of the present invention. In FIG. 1, reference numeral 1 is a substrate having a conductor layer such as a plug 2. An example of the substrate 1 is a semiconductor substrate. The plug 2 is composed of a poly-silicon (poly-Si), tungsten (w), and so forth. A thin film dielectric device 3 is formed on the conductor layer such as the plug 2. The thin film dielectric device 3 is used for an electric charge storing portion of a semiconductor memory device such as DRAM or FRAM.

In the above-described thin film dielectric device 3, reference numeral 4 is a lower electrode. A dielectric thin film 5 composed of a perovskite oxide with a film thickness of 10 to 100 nm is formed on the lower electrode 4. An upper electrode 6 is disposed on the dielectric thin film 5. A barrier layer may be disposed between the plug 2 and the lower electrode 4. The barrier layer prevents the lower electrode 4 from reacting with Si and W. In addition, the barrier layer prevents Si and W from diffusing. The material of the barrier layer is for example a noble metal such as Pt or Ru or an oxide of Ru. In addition, an adhesion layer may be disposed so as to improve adhesive characteristic. The adhesion layer is composed of Ta, TiN, $Ti_{1-x}Al_xN$, or the like.

Depending on the application of the thin film dielectric device 3, a relevant perovskite oxide having the function of dielectric is used. For example, when the thin film dielectric device 3 is used for a capacitor of a DRAM, a high dielectricity perovskite oxide such as $SrTiO_3$ (STO) or $Ba_{1-x}Sr_xTiO_3$ (BSTO) is used. When the thin film dielectric device 3 is used for an FRAM, a ferroelectric perovskite oxide such as $Pb(Zr,Ti)O_3$ (PZT), $(Pb,La)(Zr,Ti)O_3$ (PLZT), Bi—Sr—Ta—O, or Bi—Sr—Ti—O is used. As will be described later, with the dielectric thin film 5 composed of BSTO or the like that has distortion induced ferroelectricity, an electric charge storing portion of an FRAM can be structured.

The real device structure of the thin film dielectric device 3 is not limited.

Figure 2:
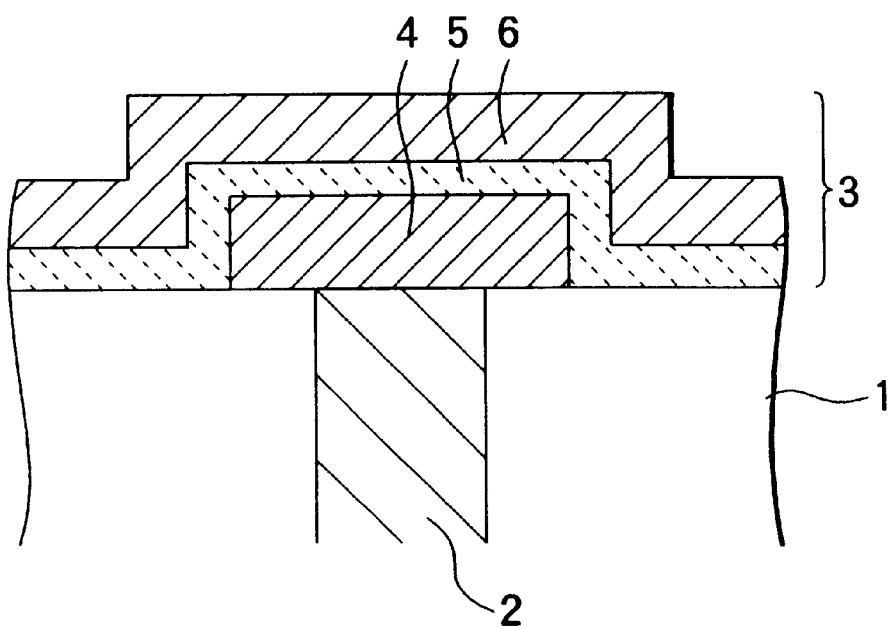
FIG. 2 is a sectional view showing another example of the structure of the thin film dielectric device shown in FIG. 1.
Figure 3:
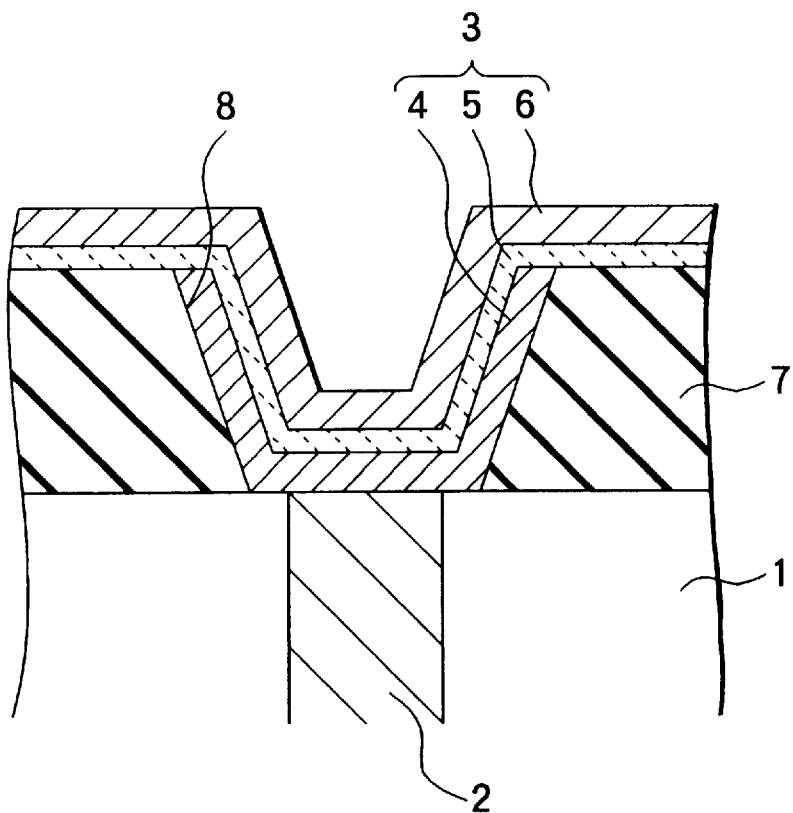
FIG. 3 is a sectional view showing a further example of the structure of the thin film dielectric device shown in FIG. 1.

Examples of the device structure of the thin film dielectric device 3 are a planar type as shown in FIG. 1, a stack type as shown in FIG. 2, and a trench type as shown in FIG. 3. In FIG. 3, reference numeral 7 is an insulation layer for forming a trench. A trench 8 is formed on the insulation layer 7. The present invention can be applied to a thin film capacitor that is a laminate film of the lower electrode 4, the dielectric thin film 5, and the upper electrode 6 that are disposed in the order.

Figure 4A:
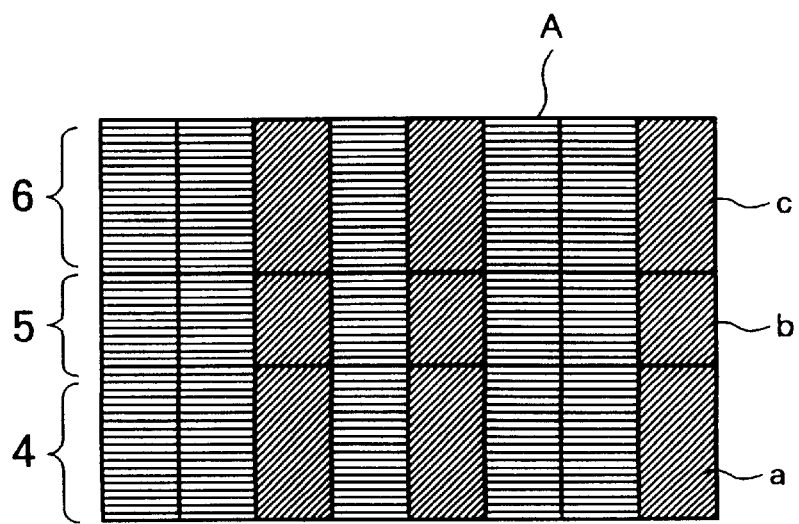
FIG. 4A is a schematic diagram showing a fine structure of a thin film dielectric device according to the present invention.
Figure 4B:
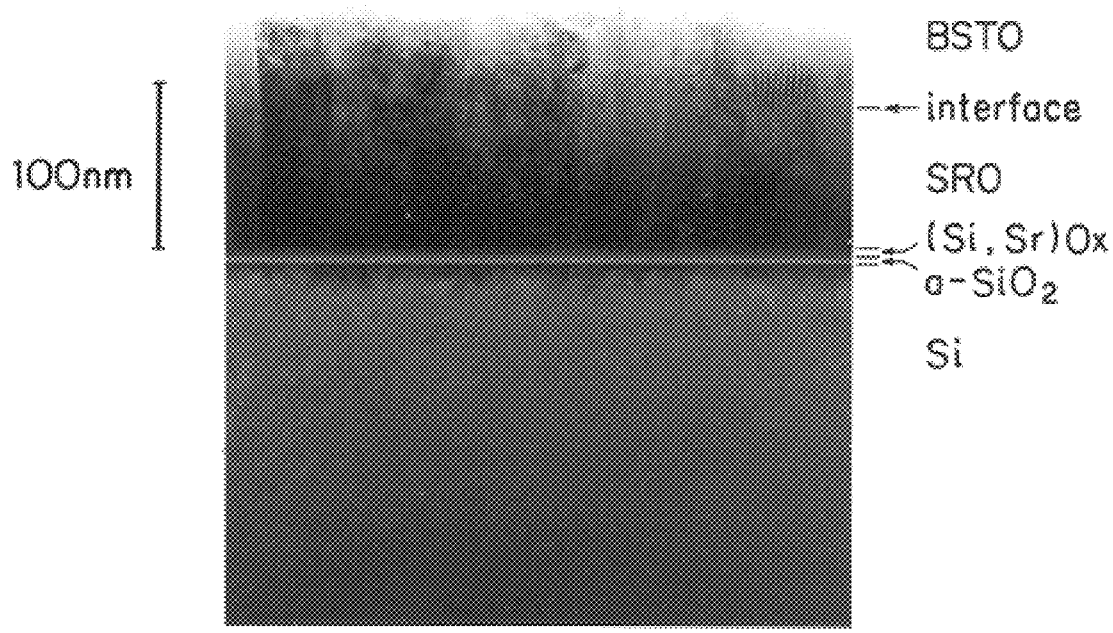
FIG. 4B is a photo taken by a microscope (TEM) showing a fine structure of the thin film dielectric device according to the present invention.

As shown in FIGS. 4A and 4B, the laminate film portion of the lower electrode 4, the dielectric thin film 5, and the upper electrode 6 is a polycrystalline film having columnar grains A that succeed in the near vertical direction to the surface of the substrate. In other words, the lower electrode 4 is composed of a polycrystalline film having crystal grains (columnar grains) a that grow in the nearly vertical direction to the surface of the substrate. The dielectric thin film 5 successively grows from the crystal grains (columnar grains) a of the lower electrode 4. In addition, the dielectric thin film 5 has crystal grains (columnar grains) b that takes over the crystal orientation of the crystal grains a. The upper electrode 6 has crystal grains (columnar grains) c that successively grow from the crystal grains (columnar grains) b of the dielectric thin film 5 and take over the crystal orientation of the crystal grains b. FIG. 4A is a schematic diagram showing a fine structure of a laminate film of the lower electrode 4, the dielectric thin film 5, and the upper electrode 6. FIG. 4B is a photo taken by a microscope (TEM) showing a fine structure of a laminate film that has been actually fabricated.

The columnar grains A are composed of crystal grains a, b, and c that successively grow in the nearly vertical direction to the surface of the substrate. In the columnar grains A, the crystal grains b take over the size and crystal orientation of the crystal grains a of the dielectric thin film 5. In addition, the crystal grains c of the upper electrode 6 take over the size and crystal orientation of the crystal grains b of the dielectric thin film 5. In the columnar grains A, the lattice constants at individual interfaces are matched. The laminate film portion of the lower electrode 4, the dielectric thin film 5, and the upper electrode 6 is composed of a polycrystalline film of a group of the columnar grains A.

As described above, in the laminate film portion of the lower electrode 4, the dielectric thin film 5, and the upper electrode 6, with the columnar grains A, the lattice constant of the lower electrode 4 and the lattice constant of the dielectric thin film 5 are matched at the interface thereof. In addition, with the columnar grains A, the lattice constant of the dielectric thin film 5 and the lattice constant of the upper electrode 6 are matched at the interface thereof. In other words, the lattice constant of the lower electrode 4 and the lattice constant of the dielectric thin film 5 are matched at the interface thereof in the columnar grains A. In addition, the lattice constant of the dielectric thin film 5 and the lattice constant of the upper electrode 6 are matched in the columnar grains A. With the partial lattice-matching, a large amount of interface levels that suppresses an excessive leak current and a decrease of dielectric breakdown resistance is prevented from taking place. In other words, the thin film dielectric device 3 can remarkably suppress the increase of the leak current and the short-circuit. In addition, the thin film dielectric device 3 has an excellent dielectric breakdown resistance.

Moreover, since the laminate film portion of the lower electrode 4, the dielectric thin film 5, and the upper electrode 6 is basically the polycrystalline film having the columnar grains A, the laminate film portion can be properly formed on the plug 2 composed of poly-silicon (poly-Si) or tungsten (W). Thus, the thin film dielectric device 3 is not restricted by the substrate unlike with a conventional epitaxial growth film. Consequently, the thin film dielectric device 3 can be applied to a real LSI circuit having a semiconductor storing device such as a DRAM and an FRAM. The thin film dielectric device 3 according to the embodiment of the present invention can be applied to a real LSI circuit. In addition, the thin film dielectric device 3 suppresses an excessive leak current and the degradation of the dielectric breakdown resistance. The thin film dielectric device 3 has improved performance, reliability, and practicability.

When a polycrystalline film having columnar grains A whose size and crystal orientation succeed from the lower electrode 4 to the upper electrode 6 is fabricated, as the lower electrode 4 and the upper electrode 6, conductive materials whose lattice constants are similar to that of the dielectric thin film 5 are used. When each film is formed, the temperature of the substrate is raised. Alternatively, after each film is formed at a low temperature, the laminate film is heat-treated. Thus, a polycrystalline film having columnar grains A is obtained.

Each film can be formed by a variety of vapor growth method such as spatter method, vacuum evaporation method, and laser ablation method. When the polycrystalline film has the columnar grains A, it is preferred that the temperature of the substrate in the film forming stage is relatively high. The temperature of the substrate is preferably 673 K or more, more preferably, 873 K or more. When each film is formed at high temperature, the columnar grains A can be reproducibly obtained. Even if each film is formed at low temperature and then heat-treated, columnar grains A may be obtained. In this case, however, the lattice matching characteristic at the interface is lower than that of the high-temperature film forming method.

In addition, to improve the flatness of the surface of each interface, the lower electrode 4 is preferably formed in two stages. When the lower electrode 4 is formed by the spatter method, an initial film is formed with a low output.

Next, the lower electrode 4 is formed on the initial film for a predetermined thickness with a normal output. Since the initial film is formed with the lower output, the surface flatness of the lower electrode 4 can be improved. As with the lower electrode 4, the dielectric thin film 5 is preferably formed in two stages. The initial film is not limited to such a positively formed film, but a film of which atoms of a target in a cleaning stage are deposited.

In the relation between the grain size and electric characteristics of the dielectric thin film 5, the dielectric constant is proportional to the grain size. Since the grain size of the dielectric thin film 5 takes over the grain size of the lower electrode 4, the grain size of the lower electrode 4 is preferably large. From the view point of the grain size, each film is preferably formed in one stage. However, when each film is formed in one stage, the morphology at the interface may degrade. When each film is formed in two stages, by adjusting the temperature of the substrate in the film forming stage, the grain size can be controlled.

The size of the columnar grains A is preferably in the range from 5 to 500 nm. Each film should be formed so that the grain size is satisfied. When the size of the columnar grains A is less than 2 nm or larger than 1000 nm, it is difficult to successively grow the columnar grains from the lower electrode 4 to the upper electrode 6.

Next, the materials of the lower electrode 4 and the upper electrode 6 will be described. The mismatch of the lattice constant of the dielectric thin film 5 to the lattice constant of the lower portion 4 is preferably 15% or less. Thus, the material of the lower electrode 4 is selected so that the mismatch of the lattice constant is 15% or less. This condition applies to the upper electrode 6. When the mismatch of the lattice constant exceeds 15%, it is difficult to form the columnar grains A that succeed from the lower electrode 4 to the upper electrode 6.

As the materials of the lower electrode 4 and the upper electrode 6, a conductive perovskite oxide with a thickness of 5 to 100 nm is preferably used so that the mismatch of the lattice constant to the dielectric thin film 5 composed of a perovskite oxide is 15% or less. As a conductive perovskite oxide, a variety of perovskite oxides having metal conductivity can be used.

Examples of the typical conductive perovskite oxide are $ARuO_3$ (where A is at least one element selected from the group consisting of Sr, Ba, Ca, La, and Nd) such as $SrRuO_3$ and $Sr_{1-x}Ba_xRuO_3$ (0<x<1) and $Sr_{1-x}RE_xCoO_3$ (where RE is at least one element selected from the group consisting of La, Pr, Sm, and Nd; $0 \leq X \leq 1$). These conductive perovskite oxides have excellent lattice matching characteristic to the perovskite oxide used for the dielectric thin film 5.

The mismatch of the lattice constants of the electrodes 4 and 6 to lattice constant of the dielectric thin film 5 is preferably 5% or less. The lower the mismatch of the lattice constant, the higher the matching characteristic of the interface. In addition, the crystalline characteristics of the dielectric thin film 5 improves. As a result, a larger dielectric constant can be obtained. The mismatch of the lattice constants of the electrodes 4 and 6 to the lattice constant of the dielectric thin film 5 is more preferably 2.5% or less.

The lattice constants of the electrodes 4 and 6 and the dielectric thin film 5 can be varied by adjusting the composition of the perovskite oxide thereof. For example, at least one of the electrodes 4 and 6 and the dielectric thin film 5 is composed of a perovskite oxide of which A site is a perovskite oxide composed of at least two elements. In such a perovskite oxide, the lattice constant can be controlled by adjusting the composition of the A site elements. When for example Sn or Zn is added to the perovskite oxide, a B site element of the perovskite oxide may be substituted with such an element. With such an adjustment of the composition, the lattice constant can be controlled. The A site elements of the present invention represent elements that are placed in the A site of the perovskite structure that is basically expressed by $ABO_3$.

The lower electrode 4 may be composed of a layered perovskite oxide that has a conductive characteristic instead of a perovskite oxide expressed by $ABO_3$. The layered perovskite oxide contributes to improving the surface flatness of the lower electrode 4. The layered perovskite oxide can be used for at least part of the lower electrode 4.

The growth speed of the layered perovskite oxide largely varies in the crystal orientation. In the initial growth stage, the growth speed in the directions of axes a and b is higher than the growth speed in the direction of axis c. When a polycrystalline film of such a material is formed, the orientations of grains deposited in an island shape are at random in the initial film forming stage. However, as the film grows, the growth speed of grains in the surface direction (namely, axes a and b) becomes higher than the growth speed in the film thickness. Thus, in the film forming stage, grains are highly oriented in the direction of the film thickness (namely, axis c). Thereafter, since the growth speed in the direction of the film thickness of each grain is the same, a conductive perovskite oxide layer with an excellent crystalline characteristic and an excellent surface flatness can be obtained.

The layered perovskite oxide that is used for at least part of the lower electrode 4 and that has conductive characteristic is composed of a polycrystalline film of which grains are highly oriented on axis c in the direction of the film thickness (namely, polycrystalline film highly oriented on axis c). When the layered perovskite oxide that has conductive characteristic is formed on a base layer such as a plug 2, a barrier layer, or an adhesion layer, the layered perovskite oxide becomes a polycrystalline film highly oriented on axis c. The polycrystalline film highly oriented on axis c has an excellent surface flatness.

Thus, when the dielectric thin film 5 composed of a perovskite oxide is formed on the lower electrode 4 composed of a layered perovskite oxide having conductive characteristic, since the dielectric thin film 5 grows taking over the surface flatness of the lower electrode 4, the morphology at the interface of the lower electrode 4 and the dielectric thin film 5 can be improved. In addition, since the front surface of the dielectric thin film 5 has excellent surface flatness, the morphology at the interface of the dielectric thin film 5 and the upper electrode 6 is also excellent.

The layered perovskite oxide used for the lower electrode 4 preferably contain at least one transition metal element selected from the group consisting of Ru, Ir, Rh, Cr, Mn, Ni, and Co that have conductive characteristic. Particularly, in consideration of the application to the silicon process of an LSI circuit or the like, a layered perovskite oxide containing at least one transition metal element selected from the group consisting of Ru, Ir, and Rh is preferably used.

For example, such a layered perovskite oxide has a composition substantially expressed by the following formula.

General Formula:

$$AE_{n+1}TM_nO_{3n+1} \quad (1)$$

(where AE is at least one element selected from the group consisting of Sr, Ba, and Ca; TM is at least one transition metal element selected from Ru, Ir, and Rh; n is 1, 2, or 3).

In addition, considering the matching characteristic with BSTO or the like that is used for a dielectric, a layered perovskite oxide that is substantially expressed by the following formula.

General Formula:

$$Sr_{n+1}TM_nO_{3n+1} \quad (2)$$

(where TM is at least one transition element selected from the group consisting of Ru, Ir, and Rh; n is 1, 2, or 3).

In these layered perovskite oxides, as the value n increases, low dimensional characteristics of crystal structure and physical properties decrease. Thus, characteristics that are close to non-layered perovskite oxide (such as $AETMO_3$) are obtained. Thus, the value n is preferably 1, 2, or 3. When the value n is 4 or more, the surface flatness of the polycrystalline based on the orientation characteristic of the layered perovskite oxide may not be obtained.

Among the layered perovskite oxides expressed by Formula (2), at least one selected from the group consisting of $Sr_2RuO_4$, $Sr_3Ru_2O_7$, and $Sr_4Ru_3O_{10}$ is preferably used because of excellent stability and excellent conductive characteristic in wide film forming conditions.

In the layered perovskite oxides expressed by Formula (2), part of Sr is substituted with such as Ba or Ca so as to adjust the surface lattice constant (axes a and b) and thereby improving the lattice matching characteristic with BSTO or the like. In addition, part of alkali earth group metal element may be substituted with a rare earth element such as La or Nd.

The layered perovskite oxides having conductive characteristic are not limited to those expressed by Formulas (1)

and (2). For example, a layered perovskite oxide that has a composition substantially expressed by the following formula may be used.

General Formula:

$$A_{n+1}TM'_nO_{3n+1} \quad (3)$$

(where A is at least one element selected from the group consisting of a rare earth element and an alkali earth element; TM' is at least one transition metal element selected from the group consisting of Cr, Mn, Ni, and Co; n is 1, 2, or 3).

Examples of the layered perovskite oxides expressed by Formula (3) are $(La_{1-x}Sr_x)_2CoO_4$, $(La_{1-x}Sr_x)_3Co_2O_7$, $(La_{1-x}Sr_x)_4Co_3O_{10}$, $(La_{1-x}Sr_x)_2CrO_4$, $(La_{1-x}Sr_x)_3Mn_2O_7$, and $(La_{1-x}Sr_x)_3Ni_2O_7$.

In the layered perovskite oxide, as the value n increases, the low dimensional characteristics of crystal structure and physical properties decrease. Thus, the layered perovskite oxide has characteristics close to those of a non-layered perovskite oxide. Consequently, the conductivity in the direction of the film thickness increases. With this property, a laminate film of n layered perovskite oxides or a laminate film of a layered perovskite oxide and a non-layered perovskite oxide may be used for the lower electrode 4.

Figure 5:
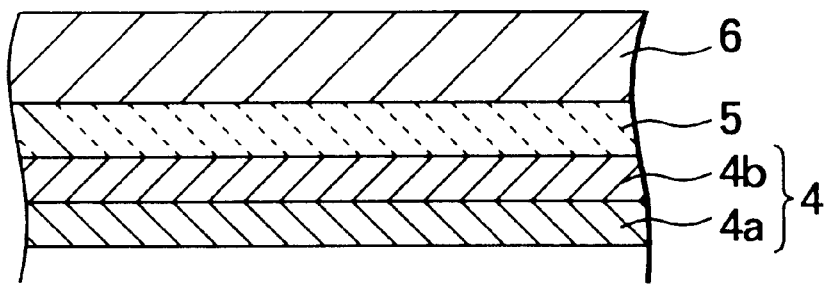
FIG. 5 is a sectional view showing an example of the structure of a lower electrode of the thin film dielectric device shown in FIG. 1.

FIG. 5 shows the structure of the lower electrode 4 composed of a laminate film of a first lower electrode layer 4a and a second lower electrode layer 4b. The first lower electrode layer 4a is composed of a polycrystalline film of a layered perovskite oxide expressed by Formula (1) or (2). The second lower electrode layer 4b is composed of a non-layered perovskite oxide such as $SrRuO_3$ and a layered perovskite oxide whose value n is large (for example, n=3, 4, . . . ).

In other words, in an initial stage of which a film is formed immediately on the plug 2 or an intermediate layer, a layered perovskite oxide expressed by Formula (1) or (2), in particular, a layered perovskite oxide whose value n is 1 or 2 (highly oriented on axis c), is deposited until a successive film is obtained. Thus, the first lower electrode layer 4a composed of the polycrystalline film highly oriented on axis c is formed. The second lower electrode layer 4b composed of the non-layered perovskite oxide of which the conductivity in the direction of axis c is high is formed on the first lower electrode layer 4a.

In such a laminate film structure, the second lower electrode layer 4b takes over the crystal orientation of the first lower electrode layer 4a. The second lower electrode layer 4b becomes a highly oriented polycrystalline film. Thus, the conductivity in the direction of the film thickness of the lower electrode 4 is improved. In addition, the morphology at the interface with the dielectric thin film 5 can be suppressed from degrading.

Figure 6:
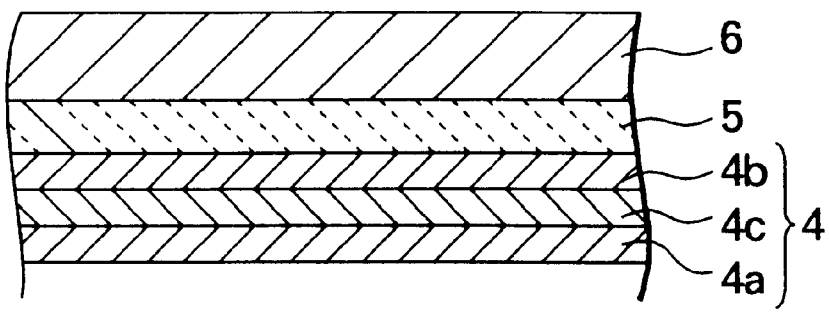
FIG. 6 is a sectional view showing another example of the structure of the lower electrode of the thin film shown in FIG. 1.

FIG. 6 shows the structure of a lower electrode 4 composed of a first lower electrode layer 4a, a second lower electrode layer 4b, and a third lower electrode layer 4c disposed therebetween. The first lower electrode layer 4a is composed of a polycrystalline film of a layered perovskite oxide highly oriented on axis c. The second lower electrode layer 4b is composed of a non-layered perovskite oxide. The third lower electrode 4c is composed of a layered perovskite oxide whose value n is large (for example, n=3, 4, . . . ).

The lower electrode 4 may be composed of a laminate film having different AE components (or A component), a laminate film having different TM components (or TM' components), or a laminate film of the combination thereof. Such a laminate film is effective for adjusting the lattice constant. Thus, with such a laminate film, the lower electrode 4 can be epitaxially grown at a local region. In addition, with such a laminate film, the surface flatness can be improved.

In the above-described embodiment, the columnar grains A are successively grown from the lower electrode 4 to the upper electrode 6. However, the present invention is not limited to such a structure. Instead, one of the laminate film of the lower electrode 4 and the dielectric thin film 5 and the laminate film of the dielectric thin film 5 and the upper electrode 6 may be a polycrystalline film having the columnar grains A that succeed in the nearly vertical direction to the surface of the substrate. For example, the laminate film of the lower electrode 4 and the dielectric thin film 5 can be a polycrystalline film having the columnar grains A. The upper electrode 6 may be a Pt electrode.

When a noble metal such as Pt, Rh, Ru, Pd, Os, or Ir is used for the lower electrode 4 and the upper electrode 6, the lattice constants of these noble metals are close to the lattice constant of the perovskite oxide, corresponding to the film forming conditions, the columnar grains A that succeed form the lower electrode 4 to the upper electrode 6 can be obtained.

Next, with reference to FIG. 7, a thin film dielectric device according to another embodiment of the present invention will be described.

Figure 7:
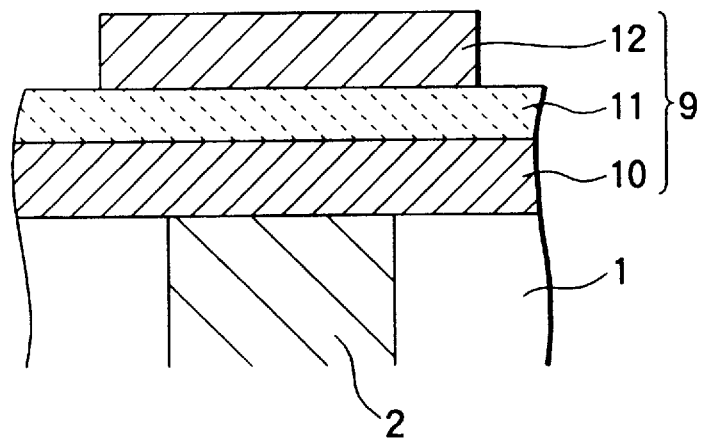
FIG. 7 is a sectional view showing the structure of a thin film dielectric device according to another embodiment of the present invention.

As with the above-described embodiment, a thin film dielectric device 9 shown in FIG. 7 is a polycrystalline film having columnar grains of which a laminate portion of a lower electrode 10, a dielectric thin film 11, and an upper electrode 12 succeed in the nearly vertical direction to the surface of a substrate. The lattice constants of these layers are matched at the interface thereof. At least one of the lower electrode 10 and the upper electrode 12 (for example, the lower electrode 10) is composed of a conductive perovskite oxide whose lattice constant is smaller than the perovskite oxide that composes the dielectric thin film 11. Thus, the dielectric thin film 11 has distortion induced ferroelectricity.

By adjusting the lattice constants of the lower electrode 10, the upper electrode 12, and the dielectric thin film 11, a thin film dielectric device 9 that has distortion induced ferroelectricity can be fabricated. At this point, the conductive perovskite oxide of the lower electrode 10 and the upper electrode 12 and the perovskite oxide of the dielectric thin film 11 preferably satisfy the following conditions. In other words, assuming that the lattice constant of the perovskite oxide (dielectric) represented by the length of axis a of the perovskite crystal structure is denoted by ad and the lattice constant of the conductive perovskite oxide (electrode) represented by the length of axis a of the perovskite crystal structure is denoted by as, the relation of $1.002 \leq ad/as \leq 1.015$ should be satisfied. When the lattice constant ratio ad/as exceeds the above range, the distortion induced ferroelectricity may not take place.

A practical example of the material of the dielectric thin film 11 is $Ba_{1-x}Sr_xTiO_3$ (where $x \leq 0.6$). Examples of the material of the lower electrode 10 and the upper electrode 12 are $AERuO_3$ (where AE is at least one element selected from the group consisting of Ba and Ca) and $Sr_{1-x}RE_xCoO_3$ (where RE is at least one element selected from the group consisting of La, Pr, Sm, and Nd; $0 \leq x<1$). At this point, part of AE of $AERuO_3$ may be substituted with for example La or Nd. With AE that is a mixture of Ca and Ba, the lattice constant can be controlled. When the lattice constant of the electrode is rather small, $Ba_{1-x}Sr_xTiO_3$ (where X>0.6) can be used as the material of the dielectric thin film, and $SrTiO_3$ also has distortion induced ferroelectricity.

The polycrystalline film highly oriented on axis c of the layered perovskite oxide having conductive characteristic can be effectively used for the lower electrode 10 and the upper electrode 12 of the thin film dielectric device 9 having the distortion induced ferroelectricity. An example of the material of the dielectric thin film 11 is $Ba_{1-x}Sr_xTiO_3$ (where $x \leq 0.6$). Examples of the material of the lower electrode 10 are $(Sr_{1-y}Ba_y)_2RuO_4$, $(Sr_{1-y}Ba_y)_3Ru_2O_7$, and $(Sr_{1-y}Ba_y)_4Ru_3O_{10}$ ($0 \leq y \leq 0.5$).

The thin film dielectric device according to the present invention is not limited to semiconductor devices such as a DRAM and an FRAM. Instead, the thin film dielectric device may be formed on a GaAs substrate and used for a capacitor for a microwave. Alternatively, the thin film dielectric device can be used for thin film capacitors of various devices such as a lower power liquid crystal display unit that uses ferroelectricity.

Next, practical embodiments of the present invention and evaluation results thereof will be described.

First Embodiment

As shown in FIG. 1, a $SrRuO_3$ film as a lower electrode 4 was deposited for 30 nm on an Si substrate 1 having a plug 2 composed of poly-silicon by RF magnetron spatter method. At this point, the temperature of the substrate was 873 K. Before the SrRuO3 film was formed, the shutter was closed and the target was cleaned. At this point, part of spatter atoms leaked from the shutter. Thus, an initial film of $SrRuO_3$ was deposited.

After the $SrRuO_3$ film was formed, a $Ba_{0.5}Sr_{0.5}TiO_3$ film as a dielectric thin film 5 was deposited for 20 nm on the lower electrode 4. A $SrRuO_3$ film as an upper electrode 6 was deposited for 30 nm on the dielectric thin film 5. Thus, a thin film capacitor for a DRAM was fabricated.

The section of the resultant thin film capacitor was observed by an electron microscope (TEM). As a result, the laminate film of the lower electrode 4, the dielectric thin film 5, and the upper electrode 6 is a polycrystalline film. The polycrystalline film was having columnar grains A of which the sizes of the dielectric thin film 5 and the upper electrodes 6 were the same in the direction of the substrate surface corresponding to the size of the crystal grains of the lower electrode 4 and the crystal orientations thereof were the same. The size in the direction of the surface of the columnar grains A was around 20 nm. In the columnar grains A, the lattice constant of the lower electrode 4 and the lattice constant of the dielectric thin film 5 were matched at the interface thereof. In addition, the lattice constant of the dielectric thin film 5 and the lattice constant of the upper electrode 6 were matched at the interface thereof. It was occasionally difficult to distinguish the boundary between each layer. As a result, ion defects hardly took place.

When the electric characteristic of the thin film capacitor according to the first embodiment was measured, the dielectric constant was 500 and the leak current at 1.8 V was $1 \times 10^{-8}$ A/cm². When a voltage of DC 10 V was applied to the thin film capacitor, a dielectric breakdown did not take place.

When the thin film capacitor with the structure according to the first embodiment was formed on an Si substrate that does not have the plug 2, the similar fine structure and characteristics were obtained.

Second Embodiment

As shown in FIG. 2, a $SrRuO_3$ film was deposited for 30 nm on a Si substrate 1 having a plug 2 (formed by selective growth method) by RF magnetron spatter method (temperature of substrate=873 K). Before the $SrRuO_3$ film was formed, the cleaning step was performed as with the first embodiment. A lower electrode 4 with an area of 0.18 $\mu$m was etched out from the $SrRuO_3$ film by reactive ion etching (RIE) method. Thus, a stack type lower electrode was formed. A $Ba_{0.5}Sr_{0.5}TiO_3$ film for 20 nm as a dielectric thin film 5 and a $SrRuO_3$ film for 30 nm as an upper electrode 6 were formed on the lower electrode 4 by RF magnetron spatter method. Thus, a thin film capacitor for a DRAM was fabricated.

The section of the resultant thin film capacitor was observed by the electron microscope (TEM). As a result, the thin film capacitor had a columnar grain structure of which the interfaces of the lower electrode 4, the dielectric thin film 5, and the upper electrode 6 were matched on the side surface and the upper surface thereof. The size of the columnar grains in the direction of the surface thereof was around 30 nm. When the electric characteristics of the thin film capacitor according to the second embodiment were measured, the dielectric constant of the thin film capacitor was 500. The leak current at 1.8 V was $1 \times 10^{-8}$ A/cm² or less. Even if a voltage of DC 10 V was applied to the thin film capacitor, a dielectric breakdown did not take place.

Third Embodiment

As shown in FIG. 3, a $SiO_2$ insulation film 7 was formed for 300 nm on an Si substrate 1 having a plug 2 (formed by the selective growing method) by plasma TEOS method. A capacitor trench 8 was formed on the $SiO_2$ insulation layer 7 by lithograph process.

Next, a $SrRuO_3$ film for 30 nm as a lower electrode 4 was deposited on the $SiO_2$ insulation layer 7 including the capacitor trench 8 (temperature of substrate=873 K). Thereafter, the surface was flatted by CMP and cells were separated. Before the $SrRuO_3$ film was formed, the cleaning process as with the first embodiment was performed.

Thereafter, a $Ba_{0.5}Sr_{0.5}TiO_3$ film for 20 nm as a dielectric thin film 5 was formed on the lower electrode 4 by RF magnetron spatter method. A $SrRuO_3$ film for 30 nm as an upper electrode 6 was deposited on the dielectric thin film 5. Thus, a thin film capacitor for a DRAM was fabricated.

The section of the resultant thin film capacitor was observed by the electron microscope (TEM). As a result, the laminate film of the lower electrode 4, the dielectric thin film 5, and the upper electrode 6 was a polycrystalline film. The polycrystalline film was having columnar grains of which the sizes of the dielectric thin film 5 and the upper electrodes 6 were the same in the direction of the substrate surface corresponding to the size of the crystal grains of the lower electrode 4 and the crystal orientations thereof were the same. The size in the direction of the surface of the columnar grains was around 30 nm. In the columnar grains, the lattice constant of the lower electrode 4 and the lattice constant of the dielectric thin film 5 were matched at the interface thereof. In addition, the lattice constant of the dielectric thin film 5 and the lattice constant of the upper electrode 6 were matched at the interface thereof. As a result, ion defects hardly took place.

When the electric characteristic of the thin film capacitor according to the third embodiment was measured, the dielectric constant was 500 and the leak current at 1.8 V was $1 \times 10^{-8}$ A/cm². When a voltage of DC 10 V was applied to the thin film capacitor, a dielectric breakdown did not take place.

Fourth Embodiment

As with the third embodiment, a $SiO_2$ insulation film 7 was formed for 300 nm on an Si substrate 1 having a plug 2 by plasma TEOS method. A capacitor trench 8 was formed on the $SiO_2$ insulation layer 7 by lithograph process.

Next, a $La_{0.5}Sr_{0.5}CoO_3$ film for 30 nm as a lower electrode 4 was deposited on the $SiO_2$ insulation layer 7 including the capacitor trench 8 (temperature of substrate=873 K).

Thereafter, the surface was flatted by CMP and cells were separated. Before the $La_{0.5}Sr_{0.5}CoO_3$ film was formed, the cleaning process as with the first embodiment was performed.

Thereafter, a $Ba_{0.5}Sr_{0.5}TiO_3$ film for 20 nm as a dielectric thin film 5 was formed on the lower electrode 4 by RF magnetron spatter method. A $La_{0.5}Sr_{0.5}CoO_3$ film for 30 nm as an upper electrode 6 was deposited on the dielectric thin film 5. Thus, a thin film capacitor for a DRAM was fabricated.

The section of the resultant thin film capacitor was observed by the electron microscope (TEM). As a result, the laminate film of the lower electrode 4, the dielectric thin film 5, and the upper electrode 6 was a polycrystalline film. The polycrystalline film was having columnar grains of which the sizes of the dielectric thin film 5 and the upper electrodes 6 were the same in the direction of the substrate surface corresponding to the size of the crystal grains of the lower electrode 4 and the crystal orientations thereof were the same. The size in the direction of the surface of the columnar grains was around 30 nm. In the columnar grains, the lattice constant of the lower electrode 4 and the lattice constant of the dielectric thin film 5 were matched at the interface thereof. In addition, the lattice constant of the dielectric thin film 5 and the lattice constant of the upper electrode 6 were matched at the interface thereof.

When the electric characteristic of the thin film capacitor according to the third embodiment was measured, the dielectric constant was 470 and the leak current at 1.8 V was $1 \times 10^{-8}$ $A/cm^2$. When a voltage of DC 10 V was applied to the thin film capacitor, a dielectric breakdown did not take place.

Fifth Embodiment

A $Ba_{0.12}Sr_{0.88}TiO_3$ film for 20 nm as a dielectric thin film was formed on a $SrRuO_3$ film (lower electrode) formed in the same manner as the first embodiment. A $SrRuO_3$ film for 30 nm as an upper electrode was deposited on the dielectric thin film. Thus, a thin film capacitor for a DRAM was fabricated.

The section of the resultant thin film capacitor was observed by the electron microscope (TEM). As a result, the laminate film of the lower electrode, the dielectric thin film, and the upper electrode was having columnar grains of which the size of each layer in the direction of the surface of the substrate was the same and the crystal orientation of each layer was the same. When the X ray diffraction of the thin film capacitor was measured, the peaks of the $SrRuO_3$ film and the $Ba_{0.12}Sr_{0.88}TiO_3$ film overlapped. The estimated lattice constant was 0.398 nm.

The electric characteristics of the thin film capacitor according to the fifth embodiment were measured. The dielectric constant of the thin film capacitor was 550. The leak current of the thin film capacitor at 1.8 V was $1 \times 10^{-8}$ $A/cm^2$ or less. When a voltage of DC 10 V was applied to the thin film capacitor, dielectric breakdown did not take place. The dielectric constant of the thin film capacitor according to the fifth embodiment was higher than the dielectric constant of the thin film capacitor according to the first embodiment. This is because the matching of the lattice constants accelerates crystal growth, thereby improving crystalline characteristics.

Sixth Embodiment

A $Ba_{0.12}Sr_{O.88}TiO_3$ film for 20 nm as a dielectric thin film was formed on a $SrRuO_3$ film (lower electrode) formed in the same manner as the second embodiment. A $SrRuO_3$ film for 30 nm as an upper electrode was deposited on the dielectric thin film. Thus, a thin film capacitor for a DRAM was fabricated.

The section of the resultant thin film capacitor was observed by the electron microscope (TEM). As a result, the laminate film of the lower electrode, the dielectric thin film, and the upper electrode was having columnar grains of which the size of each layer in the direction of the surface of the substrate was the same and the crystal orientation of each layer was the same. When the X ray diffraction of the thin film capacitor was measured, the peaks of the $SrRuO_3$ film and the $Ba_{0.12}Sr_{0.88}TiO_3$ film overlapped. The estimated lattice constant was 0.398 nm.

The electric characteristics of the thin film capacitor according to the sixth embodiment were measured. The dielectric constant of the thin film capacitor was 550. The leak current of the thin film capacitor at 1.8 V was $1 \times 10^{-8}$ $A/cm^2$ or less. When a voltage of DC 10 V was applied to the thin film capacitor, dielectric breakdown did not take place.

Seventh Embodiment

A $Ba_{0.12}Sr_{0.88}TiO_3$ film for 20 nm as a dielectric thin film was formed on a $SrRuO_3$ film (lower electrode) formed in the same manner as the third embodiment. A $SrRuO_3$ film for 30 nm as an upper electrode was deposited on the dielectric thin film. Thus, a thin film capacitor for a DRAM was fabricated.

The section of the resultant thin film capacitor was observed by the electron microscope (TEM). As a result, the laminate film of the lower electrode, the dielectric thin film, and the upper electrode was having columnar grains of which the size of each layer in the direction of the surface of the substrate was the same and the crystal orientation of each layer was the same. When the X ray diffraction of the thin film capacitor was measured, the peaks of the $SrRuO_3$ film and the $Ba_{0.12}Sr_{0.88}TiO_3$ film overlapped. The estimated lattice constant was 0.398 nm.

The electric characteristics of the thin film capacitor according to the seventh embodiment were measured. The dielectric constant of the thin film capacitor was 550. The leak current of the thin film capacitor at 1.8 V was $1 \times 10^{-8}$ $A/cm^2$ or less. When a voltage of DC 10 V was applied to the thin film capacitor, dielectric breakdown did not take place.

Eighth Embodiment

A $Ba_{0.12}Sr_{0.88}TiO_3$ film for 20 nm as a dielectric thin film was formed on a $La_{0.1}Sr_{0.9}CoO_3$ film (lower electrode) formed in the same manner as the fourth embodiment. A $La_{0.1}Sr_{0.9}CoO_3$ film for 30 nm as an upper electrode was deposited on the dielectric thin film. Thus, a thin film capacitor for a DRAM was fabricated.

The section of the resultant thin film capacitor was observed by the electron microscope (TEM). As a result, the laminate film of the lower electrode, the dielectric thin film, and the upper electrode was having columnar grains of which the size of each layer in the direction of the surface of the substrate was the same and the crystal orientation of each layer was the same. When the X ray diffraction of the thin film capacitor was measured, the peaks of the $La_{0.1}Sr_{0.9}CoO_3$ film and the $Ba_{0.1}Sr_{0.9}TiO_3$ film overlapped. The estimated lattice constant was 0.398 nm.

The electric characteristics of the thin film capacitor according to the eighth embodiment were measured. The dielectric constant of the thin film capacitor was 520. The leak current of the thin film capacitor at 1.8 V was $1 \times 10^{-8}$ $A/cm^2$ or less. When a voltage of DC 10 V was applied to the thin film capacitor, dielectric breakdown did not take place.

Ninth Embodiment

A reverse spatter process was performed so as to clean the surface of the substrate in an Ar (=50 sccm) atmosphere for five minutes with an RF output of 120 W.

A SrRuO$_3$ film as a lower electrode was formed on the substrate by the spatter process in an Ar/O$_2$ (=40/10 sccm) atmosphere. The pressure in the chamber in the spatter stage was 0.7 Pa. The distance between the target and the substrate was 85 mm. The SrRuO$_3$ film was formed in two stages. As the film forming conditions in the first stage, the RF output was 90 W and the spatter time was 10 min. As the film forming conditions in the second stage, the RF output was 300 W and the spatter time was 20 min. The temperature of the substrate was 873 K. The thickness of the SrRuO$_3$ film was around 30 nm.

Next, a Ba$_{0.5}$Sr$_{0.5}$TiO$_3$ film as a dielectric film was formed on the SrRuO$_3$ film in an Ar/O$_2$ (=40/10 sccm) atmosphere by the spatter method. The pressure in the chamber in the spatter stage was 0.7 Pa. The distance between the target and the substrate was 140 mm. The Ba$_{0.5}$Sr$_{0.5}$TiO$_3$ film was formed in two stages. As film forming conditions in the first stage, the RF output was 60 W and the spatter time was 10 min. As film forming conditions in the second stage, the RF output was 500 W and the spatter time was 10 min. The temperature of the substrate was 873 K. The thickness of the Ba$_{0.5}$Sr$_{0.5}$TiO$_3$ film was around 20 nm.

A SrRuO$_3$ film as an upper electrode was formed on the Ba$_{0.5}$Sr$_{0.5}$TiO$_3$ film in the same conditions as the lower electrode. Thus, a thin film capacitor for a DRAM was fabricated.

On the other hand, a thin film capacitor for a DRAM was fabricated in the same conditions except that each film was formed in one stage. The film forming conditions of each film were the same as those of the second stage.

The section of each thin film capacitor was observed by the electron microscope (TEM). As a result, the laminate film of the lower electrode 4, the dielectric thin film 5, and the upper electrode 6 was having columnar grains of which the size of each layer in the direction of the surface of the substrate was the same and the crystal orientation of each layer was the same. When each film was formed in two stages, the size of the columnar grains in the direction of the surface was around 75 nm. When each film was formed in one stage, the size of the columnar grains in the direction of the surface was around 113 nm.

The electric characteristics of each thin film capacitor were measured. The dielectric constant was measured by an LCR meter in conditions that the measured frequency was 100 k and the amplitude was 0.1 V. The dielectric constant of the thin film capacitor formed in two stages was around 520. The dielectric constant of the thin film capacitor formed in one stage was around 570. The leak current of the thin film capacitor formed in two stages was 1×10$^{-8}$ A/cm$^2$ at ±3 V. The leak current of the thin film capacitor formed in one stage was 1×10$^{-8}$ A/cm$^2$ at 1 V. This situation results from a protrusion due to an abnormal grain growth.

Tenth to Nineteenth Embodiments

As shown in FIG. 3, a SiO$_2$ insulation layer 7 was formed for 100 nm on an Si substrate 1 having a plug 2 (composed of poly-silicon) by plasma TEOS method. A capacitor trench 8 was formed on a SiO$_2$ insulation layer 7 by lithography process. A TiAlN film for 10 nm and a Pt film for 10 nm were successively deposited as intermediate layers on the insulation layer 7 including the capacitor trench 8 by DC spatter method.

Next, a lower electrode 4 was deposited by RF magnetron spatter method. Thereafter, the front surface was flattened by CMP method. In addition, cells were separated. A dielectric thin film 5 was deposited on the lower electrode 4 by the RF magnetron spatter method. An upper electrode 6 was deposited on the dielectric thin film 5. Table 1 shows the structural material and film thickness of the lower electrode 4, the dielectric thin film 5, and the upper electrode 6 of each of the thin film capacitors for DRAMs according to tenth embodiment to nineteenth embodiment.

Samples for a transmission electron microscope were made from the thin film capacitors according to the tenth embodiment to the nineteenth embodiment. The samples were observed by the transmission type electron microscope. As a result, the lower electrode was a polycrystalline film highly oriented on axis c. In addition, the dielectric thin film and the upper electrode were highly oriented films that had an interface of a local epitaxial structure that took over the crystal orientation. The morphology at the interface of the lower electrode and the dielectric thin film and at the interface of the dielectric thin film and the upper electrode were excellent. The average roughness was 1 nm or less.

The electric characteristics of the thin film capacitors according to the individual embodiments were measured. Table 1 shows the dielectric constant of each thin film capacitor. The leak current density at 2.5 V was 1×10$^{-8}$ A/cm$^2$ or less. When a voltage of DC 10 V was applied, dielectric breakdown did not take place.

TABLE 1

| | Lower electrode | Dielectric thin film | Upper electrode | Electric constant |
|---|---|---|---|---|
| Tenth embodiment | Sr2RuO4 (30 nm) | Ba0.2Sr0.8TiO3 (20 nm) | Sr2RuO4 (100 nm) | 490 |
| Eleventh embodiment | Sr3Ru2O7 (30 nm) | Ba0.2Sr0.8TiO3 (20 nm) | Sr3Ru2O7 (100 nm) | 480 |
| Twelfth embodiment | Sr4Ru3O10 (30 nm) | Ba0.2Sr0.8TiO3 (20 nm) | Sr4Ru3O10 (30 nm) | 500 |
| Thirteenth embodiment | Sr2IrO4 (30 nm) | Ba0.2Sr0.8TiO3 (20 nm) | Sr2IrO4 (100 nm) | 490 |
| Fourteenth embodiment | Sr3Ir2O7 (30 nm) | Ba0.2Sr0.8TiO3 (20 mn) | Sr3Ir2O7 (100 nm) | 480 |
| Fifteenth embodiment | Sr4Ir3O10 (30 nm) | Ba0.2Sr0.8TiO3 (20 nm) | Sr4Ir3O10 (30 nm) | 500 |
| Sixteenth embodiment | Sr2RhO4 (30 nm) | Ba0.2Sr0.8TiO3 (20 nm) | Sr2RhO4 (100 nm) | 490 |
| Seventeenth embodiment | Sr3Rh2O7 (30 nm) | Ba0.2Sr0.8TiO3 (20 nm) | Sr3Rh2O7 (100 nm) | 480 |
| Eighteenth embodiment | Sr4Rh3O10 (30 nm) | Ba0.2Sr0.8TiO3 (20 nm) | Sr4Rh3O10 (30 nm) | 500 |
| Nineteenth embodiment | Sr2RuO4 (10 nm)/ SrRuO3 (20 nm) | Ba0.2Sr0.8TiO3 (20 nm) | SrRuO3 (100 nm) | 480 |

Twentieth Embodiment

As shown in FIG. 5, a SrRuO$_3$ film as a lower electrode 10 was deposited for 30 nm on a Si substrate having a plug 2 composed of poly-silicon by RF magnetron spatter method. At this point, the temperature of the substrate was 873 K. A Ba$_{0.8}$Sr$_{0.2}$TiO$_3$ film as a dielectric thin film 11 was deposited for 20 nm on the lower electrode 10. A SrRuO$_3$ film as an upper electrode 13 was deposited for 30 nm on the dielectric thin film 11. Thus, a thin film capacitor for an FRAM was fabricated.

The section of the resultant thin film capacitor was observed by the electron microscope (TEM). As a result, the laminate film of the lower electrode 10, the dielectric thin film 11, and the upper electrode 12 was a polycrystalline film. The polycrystalline film was having columnar grains of which the sizes of the dielectric thin film 11 and the upper electrodes 12 were the same in the direction of the substrate surface corresponding to the size of the crystal grains of the lower electrode 10 and the crystal orientations thereof were the same. In the columnar grains, the lattice constant of the lower electrode 10 and the lattice constant of the dielectric thin film 11 were matched at the interface thereof. In addition, the lattice constant of the dielectric thin film 11 and the lattice constant of the upper electrode 12 were matched at the interface thereof. It was occasionally difficult to distinguish the boundary between each layer. As a result, ion defects hardly took place.

Figure 8:
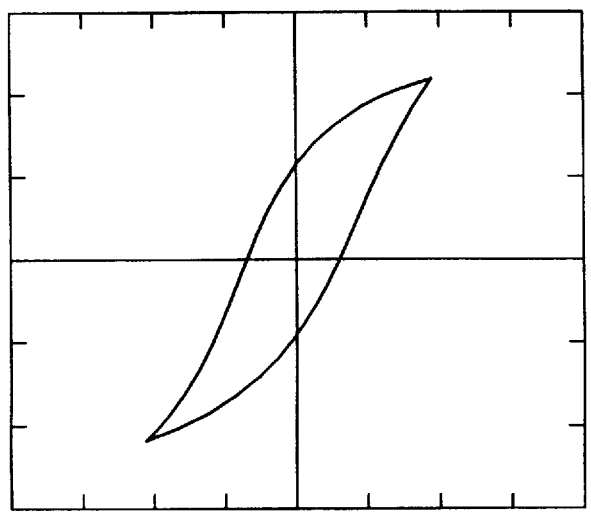
FIG. 8 is a hysteresis curve of polarization and electric field (P-E) of a thin film dielectric device fabricated according to twentieth embodiment.

When the X-ray diffraction of the fabricated sample was measured, the lattice constant of axis c of the $SrRuO_3$ film as the lower electrode 10 and the upper electrode 12 was 0.398 nm. The lattice constant of axis c of the $Ba_{0.8}Sr_{0.2}TiO_3$ film as the dielectric thin film 11 was 0.403 nm. FIG. 8 shows a hysteresis curve of polarization to electric field (P-E) of the fabricated thin film capacitor. In this embodiment, with a soyatower circuit, an AC voltage at 5 kHz was applied and a hysteresis curve was measured at a room temperature. As is clear from FIG. 8, the polarization of the thin film capacitor represents a hysteresis due to the relation with the applied electric field.

In the thin film capacitor according to this embodiment, the $Ba_{0.8}Sr_{0.2}TiO_3$ thin film had ferroelectricity. The intensity of the residual dielectric obtained from the hysteresis curve shown in FIG. 8 was as large as 0.11 $C/m^2$. When the electric characteristics of the thin film capacitor according to the embodiment were measured, the dielectric constant thereof was 600 and the leak current at 1.8 V was $1 \times 10^{-8}$ $A/cm^2$ or less. When a voltage of DC 10 V was applied to the thin film capacitor, dielectric breakdown did not take place. Thus, the thin film capacitor according to this embodiment can be used for an FRAM.

Twenty-First Embodiment

As with the twentieth embodiment, a $La_{0.5}Sr_{0.5}CoO_3$ film as a lower electrode 10 was deposited for 300 nm on a Si substrate having a plug 2 composed of poly-silicon by RF magnetron spatter method. At this point, the temperature of the substrate was 873 K. A $Ba_{0.8}Sr_{0.2}TiO_3$ film as a dielectric thin film 11 was deposited for 20 nm on the lower electrode 10. A $La_{0.5}Sr_{0.5}CoO_3$ film as an upper electrode 12 was deposited for 30 nm on the dielectric thin film 11. Thus, a thin film capacitor for an FRAM was fabricated.

The section of the resultant thin film capacitor was observed by the electron microscope (TEM). As a result, the laminate film of the lower electrode 10, the dielectric thin film 11, and the upper electrode 12 was a polycrystalline film. The polycrystalline film was having columnar grains of which the sizes of the dielectric thin film 11 and the upper electrodes 12 were the same in the direction of the substrate surface corresponding to the size of the crystal grains of the lower electrode 10 and the crystal orientations thereof were the same. In the columnar grains, the lattice constant of the lower electrode 10 and the lattice constant of the dielectric thin film 11 were matched at the interface thereof. In addition, the lattice constant of the dielectric thin film 11 and the lattice constant of the upper electrode 12 were matched at the interface thereof. It was occasionally difficult to distinguish the boundary between each layer. As a result, ion loss hardly took place.

When the X-ray diffraction of the fabricated sample was measured, the lattice constant of axis c of the $La_{0.5}Sr_{0.5}CoO_3$ film as the lower electrode 10 and the upper electrode 12 was 0.389 nm. The lattice constant of axis c of the $Ba_{0.8}Sr_{0.2}TiO_3$ film as the dielectric thin film 11 was 0.403 nm. As with the twentieth embodiment, the hysteresis curve of polarization to electric field (P-E) of the fabricated thin film capacitor was measured. As a result, a hysteresis curve as shown in FIG. 8 was obtained. As is clear from FIG. 8, the polarization of the thin film capacitor represents a hysteresis due to the relation with the applied electric field.

In other words, in the thin film capacitor according to this embodiment, the $Ba_{0.8}Sr_{0.2}TiO_3$ thin film had ferroelectricity. The intensity of the residual dielectric obtained from the hysteresis curve was as large as 0.12 $C/m^2$. When the electric characteristics of the thin film capacitor according to the embodiment were measured, the dielectric constant thereof was 610 and the leak current at 1.8 V was $1 \times 10^{-8}$ $A/cm^2$ or less. When a voltage of DC 10 V was applied to the thin film capacitor, dielectric breakdown did not take place. Thus, the thin film capacitor according to this embodiment can be used for an FRAM.

Twenty-Second Embodiment

As with the twentieth embodiment, a $Nd_{0.5}Sr_{0.5}CoO_3$ film as a lower electrode 10 was deposited for 300 nm on a Si substrate having a plug 2 composed of poly-silicon by RF magnetron spatter method. At this point, the temperature of the substrate was 873 K. A $Ba_{0.8}Sr_{0.2}TiO_3$ film as a dielectric thin film 11 was deposited for 20 nm on the lower electrode 10. A $Nd_{0.5}Sr_{0.5}CoO_3$ film as an upper electrode 12 was deposited for 30 nm on the dielectric thin film 11. Thus, a thin film capacitor for an FRAM was fabricated.

The section of the resultant thin film capacitor was observed by the electron microscope (TEM). As a result, the laminate film of the lower electrode 10, the dielectric thin film 11, and the upper electrode 12 was a polycrystalline film. The polycrystalline film was having columnar grains of which the sizes of the dielectric thin film 11 and the upper electrodes 12 were the same in the direction of the substrate surface corresponding to the size of the crystal grains of the lower electrode 10 and the crystal orientations thereof were the same. In the columnar grains, the lattice constant of the lower electrode 10 and the lattice constant of the dielectric thin film 11 were matched at the interface thereof. In addition, the lattice constant of the dielectric thin film 11 and the lattice constant of the upper electrode 12 were matched at the interface thereof. It was occasionally difficult to distinguish the boundary between each layer. As a result, ion loss hardly took place.

When the X-ray diffraction of the fabricated sample was measured, the lattice constant of axis c of the $Nd_{0.5}Sr_{0.5}CoO_3$ film as the lower electrode 10 and the upper electrode 12 was 0.386 nm. The lattice constant of axis c of the $Ba_{0.8}Sr_{0.2}TiO_3$ film as the dielectric thin film 11 was 0.403 nm. As with the twentieth embodiment, the hysteresis curve of polarization to electric field (P-E) of the fabricated thin film capacitor was measured. As a result, a hysteresis curve as shown in FIG. 8 was obtained. As is clear from FIG. 8, the polarization of the thin film capacitor represents a hysteresis due to the relation with the applied electric field.

In other words, in the thin film capacitor according to this embodiment, the $Ba_{0.8}Sr_{0.2}TiO_3$ thin film had ferroelectricity. The intensity of the residual dielectric obtained from the hysteresis curve was as large as 0.10 $C/m^2$. When the electric characteristics of the thin film capacitor according to the embodiment were measured, the dielectric constant thereof was 580 and the leak current at 1.8 V was $1 \times 10^{-8}$ $A/cm^2$ or less. When a voltage of DC 10 V was applied to the thin film capacitor, dielectric breakdown did not take place. Thus, the thin film capacitor according to this embodiment can be used for an FRAM.

In the thin film capacitors for the FRAMs according to the twentieth to twenty-second embodiments, as with the ninth embodiment, the two-stage film forming method can be used. With the two-stage film forming method, more excellent results can be obtained.

Twenty-Third to Thirty-Second Embodiments

As shown in FIG. 2, a TiAlN film for 10 nm and a Pt film for 10 nm were formed as intermediate layers on a Si substrate 1 having a plug 2 composed of poly-silicon by DC spatter method.

axis c) in the vertical direction to the surface of the substrate of the $Ba_{0.5}Sr_{0.5}TiO_3$ film was 0.410 nm that was much larger than the length of axis c of the conventional polycrystalline film (0.401 nm).

In addition, the electric characteristics of the thin film capacitors according to these embodiments were measured. As a result, the thin film capacitors have ferroelectricity. FIG. 2 shows the residual polarization and resistance against electric field of each embodiment.

TABLE 2

|  | Lower electrode | Ferroelectric thin film | Upper electrode | Residual polarization (C/m2) | Resistance against electric field |
|---|---|---|---|---|---|
| Twenty-third embodiment | Sr2RuO4 (30 nm) | Ba0.8Sr0.2 TiO3 (20 nm) | Sr2RuO4 (100 nm) | 0.35 | 3.2 |
| Twenty-fourth embodiment | Sr3Ru2O7 (30 nm) | Ba0.8Sr0.2 TiO3 (20 nm) | Sr3Ru2O7 (100 nm) | 0.35 | 3.2 |
| Twenty-fifth embodiment | Sr4Ru3O10 (30 nm) | Ba0.8Sr0.2 TiO3 (20 nm) | Sr4Ru3O10 (100 nm) | 0.35 | 3.2 |
| Twenty-sixth embodiment | Sr2IrO4 (30 nm) | Ba0.8Sr0.2 TiO3 (20 nm) | Sr2IrO4 (100 nm) | 0.34 | 3.1 |
| Twenty-seventh embodiment | Sr3Ir2O7 (30 nm) | Ba0.8Sr0.2 TiO3 (20 nm) | Sr3Ir2O7 (100 nm) | 0.30 | 3.2 |
| Twenty-eighth embodiment | Sr4Ir3O10 (30 nm) | Ba0.8Sr0.2 TiO3 (20 nm) | Sr4Ir3O10 (100 nm) | 0.30 | 3.2 |
| Twenty-ninth embodiment | Sr2RhO4 (30 nm) | Ba0.8Sr0.2 TiO3 (20 nm) | Sr2RhO4 (100 nm) | 0.35 | 3.2 |
| Thirtieth embodiment | Sr3Rh2O7 (30 nm) | Ba0.8Sr0.2 TiO3 (20 nm) | Sr3Rh2O7 (100 nm) | 0.30 | 3.2 |
| Thirty-first embodiment | Sr4Rh3O10 (30 nm) | Ba0.8Sr0.2 TiO3 (20 nm) | Sr4Rh3O10 (100 nm) | 0.30 | 3.2 |
| Thirty-second embodiment | Sr2RuO4 (10 nm)/ SrRuO3 (20 nm) | Ba0.8Sr0.2 TiO3 (20 nm) | SrRuO3 (100 nm) | 0.35 | 3.2 |

Thereafter, a lower electrode 4 was deposited by RF magnetron spatter method. Cells were etched out and separated. A dielectric thin film 5 was deposited on the lower electrode 4 by the RF magnetron spatter method. An upper electrode 6 was deposited on the dielectric thin film 5. Thus, a thin film capacitor for an FRAM was fabricated. Table 2 shows the material and film thickness of each of the lower electrode 4, the dielectric thin film, and the upper electrode. Thus, the thin film capacitors for FRAMs according to the twenty-third to the thirty-second embodiments were fabricated.

Samples for a transmission electron microscope were made from the thin film capacitors according to the twenty-third embodiment to the thirty-second embodiment. The samples were observed by the transmission type electron microscope. As a result, the lower electrode was a polycrystalline film highly oriented on axis c. In addition, the dielectric thin film and the upper electrode were highly oriented films that had an interface of a local epitaxial structure that took over the crystal orientation.

The lattice constant of each dielectric thin film of each sample was measured. The lattice constant (the length of Next, another embodiment will be described.

A layered perovskite oxide film composed of $Sr_{0.2}RuO_3$, $Sr_3Ru_2O_7$, $Sr_4Ru_3O_{10}$, or the like as a lower electrode was epitaxially grown on a $SrTiO_3$ substrate by RF magnetron spatter method. A $Ba_{0.2}Sr_{0.8}TiO_3$ film as a dielectric thin film was epitaxially grown on the lower electrode by the RF magnetron spatter method. A layered perovskite oxide film as an upper electrode was epitaxially grown on the dielectric thin film. Thus, a thin film capacitor for a DRAM was fabricated. When electric characteristics of the thin film capacitor were measured, an excellent dielectric constant was obtained. In addition, excellent results for leak current and dielectric breakdown resistance were obtained. A layered perovskite oxide is effective when each film composing a thin film capacitor is epitaxially grown.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A thin film dielectric device, comprising:

a substrate having a capacitor surface;

a lower electrode formed on said substrate and composed of a polycrystalline film having columnar grains that have grown in a vertical to a capacitor surface of said substrate;

a dielectric thin film formed on said lower electrode and composed of a perovskite oxide, said dielectric thin film being a polycrystalline film having columnar grains that have successively grown from the columnar grains of said lower electrode and that takes over a crystal orientation of said lower electrode in each of said columnar grains of said dielectric thin film, the lattice constant of said dielectric thin film being in each of said columnar grains thereof substantially matched with the lattice constant of said lower electrode at the interface with the columnar grains of said lower electrode; and an upper electrode formed on said dielectric thin film.

2. The thin film dielectric device as set forth in claim 1, wherein said upper electrode is composed of a polycrystalline film having columnar grains that have successively grown from the columnar grain of said dielectric thin film and that has taken over a crystal orientation of said dielectric thin film in each of said columnar grains of said upper electrode, the lattice constant of said upper electrode being substantially matched in each of said columnar grains thereof with the lattice constant of said dielectric thin film at the interface with the columnar grains of said dielectric thin film.

3. The thin film dielectric device as set forth in claim 1, wherein the mismatch of the lattice constant of said dielectric thin film to the lattice constant of said lower electrode is 15% or less.

4. The thin film dielectric device as set forth in claim 1, wherein said lower electrode is composed of a conductive perovskite oxide.

5. The thin film dielectric device as set forth in claim 1, wherein said lower electrode is at least one selected from the group consisting of $ARuO_3$ (where A is at least one element selected from the group consisting of Sr, Ba, Ca, La, and Nd) and $Sr_{1-x}RE_xCoO_3$ (where RE is at least one element selected from the group consisting of La, Pr, Sm, and Nd).

6. The thin film dielectric device as set forth in claim 4, wherein the mismatch of the lattice constant of the perovskite oxide composing said dielectric thin film to the lattice constant of the conductive perovskite oxide composing said lower electrode is 15% or less.

7. The thin film dielectric device as set forth in claim 4, wherein the mismatch of the lattice constant of the perovskite oxide composing said dielectric thin film to the lattice constant of the conductive perovskite oxide composing said lower electrode is 5% or less.

8. The thin film dielectric device as set forth in claim 7, wherein at least one of the conductive perovskite oxide composing said lower electrode and the perovskite oxide composing said dielectric thin film is composed of a perovskite oxide having two or more A site elements, the two or more A site elements having a composition at which the mismatch of the lattice constant of said dielectric thin film to the lattice constant of said lower electrode being 5% or less.

9. The thin film dielectric device as set forth in claim 1, wherein said substrate is composed of a semiconductor substrate.

10. The thin film dielectric device as set forth in claim 1, wherein said lower electrode has at least a layered perovskite oxide layer.

11. The thin film dielectric device as set forth in claim 10, wherein the layered perovskite oxide has at least one transition metal element selected from the group consisting of Ru, Ir, Rh, Cr, Mn, Ni, and Co.

12. The thin film dielectric device as set forth in claim 10, wherein the layered perovskite oxide has a composition substantially expressed by the following formula $$AE_{n+1}TM_nO_{3n+1}$$

(where AE is at least one element selected from the group consisting of Sr, Ba, and Ca; TM is at least one transition metal element selected from the group consisting of Ru, Ir, and Rh; and n is 1, 2, or 3).

13. The thin film dielectric device as set forth in claim 10, wherein the layered perovskite oxide is composed of at least one selected from the group consisting of $Sr_2RuO_4$, $Sr_3Ru_2O_7$, and $Sr_4Ru_3O_{10}$.

14. The thin film dielectric device as set forth in claim 1, wherein said lower electrode is composed of a conductive perovskite oxide having a lattice constant smaller than the lattice constant of said dielectric thin film so as to cause said dielectric thin film to have distortion induced ferroelectricity.

15. The thin film dielectric device as set forth in claim 14, wherein assuming that the lattice constant of the perovskite oxide represented by the length of axis a of a perovskite crystal structure is denoted by ad and that the lattice constant of the conductive perovskite oxide represented by the length of axis a of the perovskite crystal structure is denoted by as, the relation of $1.002 \leq ad/as \leq 1.015$ is satisfied.

16. A thin film dielectric device, comprising:

a substrate having a capacitor surface;

a lower electrode formed on said substrate;

a dielectric thin film formed on said lower electrode and composed of a perovskite oxide, said dielectric thin film being a polycrystalline film having columnar grains that have grown in a vertical to the capacitor surface of said substrate; and an upper electrode formed on said dielectric thin film, said upper electrode being composed of a polycrystalline film having columnar grains that have successively grown from the columnar grains of said dielectric thin film and that have taken over the crystal orientation of said dielectric thin film in each of said columnar grains of said upper electrode, the lattice constant of said upper electrode being in each of said columnar grains thereof substantially matched with the lattice constant of said dielectric thin film at the interface with the columnar grains of said dielectric thin film.

17. The thin film dielectric device as set forth in claim 16, wherein the mismatch of the lattice constant of said dielectric thin film to the lattice constant of said upper electrode is 15% or less.

18. The thin film dielectric device as set forth in claim 16, wherein said upper electrode is composed of a conductive perovskite oxide.

19. The thin film dielectric device as set forth in claim 16, wherein said upper electrode is at least one selected from the group consisting of $ARuO_3$ (where A is at least one element selected from the group consisting of Sr, Ba, Ca, La, and Nd) and $Sr_{1-x}RE_xCoO_3$ (where RE is at least one element selected from the group consisting of La, Pr, Sm, and Nd).

20. The thin film dielectric device as set forth in claim 18, wherein the mismatch of the lattice constant of the perovskite oxide composing said dielectric thin film to the lattice constant of the conductive perovskite oxide composing said upper electrode is 15% or less.

21. The thin film dielectric device as set forth in claim 18, wherein the mismatch of the lattice constant of the perovskite oxide composing said dielectric thin film to the lattice constant of the conductive perovskite oxide composing said upper electrode is 5% or less.

22. The thin film dielectric device as set forth in claim 21, wherein at least one of the perovskite oxide composing said dielectric thin film and the conductive perovskite oxide composing said upper thin film is composed of a perovskite oxide having two or more A site elements, the two or more A site elements having a composition at which the mismatch of the lattice constant of said dielectric thin film to the lattice constant of said upper electrode being 5% or less.

* * * * *